United States Patent
Udrea et al.

(10) Patent No.: US 11,081,578 B2
(45) Date of Patent: Aug. 3, 2021

(54) III-V DEPLETION MODE SEMICONDUCTOR DEVICE

(71) Applicant: Cambridge GaN Devices Limited, Cambourne (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: CAMBRIDGE GAN DEVICES LIMITED, Cambourne (GB)

( * ) Notice: Subject to any disclaimer, the term of this patent is extended or adjusted under 35 U.S.C. 154(b) by 0 days.

(21) Appl. No.: 16/405,457

(22) Filed: May 7, 2019

(65) Prior Publication Data

US 2020/0357906 A1    Nov. 12, 2020

(51) Int. Cl.
| | |
|---|---|
| *H01L 29/778* | (2006.01) |
| *H01L 29/20* | (2006.01) |
| *H01L 27/07* | (2006.01) |
| *H01L 29/66* | (2006.01) |
| *H01L 21/02* | (2006.01) |
| *H01L 29/205* | (2006.01) |

(52) U.S. Cl.
CPC ...... *H01L 29/7786* (2013.01); *H01L 21/0254* (2013.01); *H01L 27/0727* (2013.01); *H01L 29/2003* (2013.01); *H01L 29/205* (2013.01); *H01L 29/66462* (2013.01)

(58) Field of Classification Search
CPC ............... H01L 29/7786; H01L 29/205; H01L 29/66462; H01L 27/0629
See application file for complete search history.

(56) References Cited

U.S. PATENT DOCUMENTS

| | | |
|---|---|---|
| 2014/0015591 A1 | 1/2014 | Chen |
| 2014/0042452 A1 | 2/2014 | Pendharkar |

(Continued)

OTHER PUBLICATIONS

Injun Hwang et al., "1.6kV, 2.9 mΩ cm2 Normally-off p-GaN HEMT Device", Proceedings of the 2012 24th International Symposium on Power Semiconductor Devices and ICs 3-7, Jun. 2012—Bruges, Belgium, 4 pages.

(Continued)

*Primary Examiner* — Cuong Q Nguyen
(74) *Attorney, Agent, or Firm* — Tucker Ellis LLP

(57) ABSTRACT

We disclose herein a depletion mode III-nitride semiconductor based heterojunction device, comprising: a substrate; a III-nitride semiconductor region formed over the substrate, wherein the III-nitride semiconductor region comprises a heterojunction comprising at least one two-dimensional carrier gas of second conductivity type; a first terminal operatively connected to the III-nitride semiconductor region; a second terminal laterally spaced from the first terminal in a first dimension and operatively connected to the III-nitride semiconductor region; at least two highly doped semiconductor regions of a first conductivity type formed over the III-nitride semiconductor region, the at least two highly doped semiconductor regions being formed between the first terminal and the second terminal; and a gate terminal formed over the at least two highly doped semiconductor regions; wherein the at least two highly doped semiconductor regions are spaced from each other in a second dimension.

18 Claims, 10 Drawing Sheets

(56) References Cited

U.S. PATENT DOCUMENTS

| | | | |
|---|---|---|---|
| 2014/0103969 A1* | 4/2014 | Jeon | H01L 29/7786 327/109 |
| 2015/0076563 A1 | 3/2015 | Yu | |
| 2017/0301780 A1* | 10/2017 | Boles | H01L 29/7786 |

OTHER PUBLICATIONS

Man Ho Kwan et al., "CMOS-Compatible GaN-on-Si Field-Effect Transistors for High Voltage Power Applications", pp. 17.6.1-17.6.4, 2014, 4 pages.

Silvia Lenci et al., "Au-Free AlGaN/GaN Power Diode on 8-in Si Substrate With Gated Edge Termination", IEEE Electron Device Letters, vol. 34, No. 8, Aug. 2013, 3 pages.

Umesh K. Mishra et al., "GaN-Based RF Power Devices and Amplifiers", Proceedings of the IEEE, vol. 96, No. 2, Feb. 2008, pp. 287-305, 19 pages.

Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, July 2008, pp. 668-669, 3 pages.

Yasuhiro Uemoto et al., "Gate Injection Transistor (GIT)—A Normally-Off AlGaN/GaN Power Transistor Using Conductivity Modulation", IEEE Transactions on Electron Devices, vol. 54, No. 12, December 2007, pp. 3393-3399, 7 pages.

Michael J. Uren et al., "Buffer Design to Minimize Current Collapse in GaN/AlGaN HFETs", IEEE Transactions on Electron Devices, vol. 59, No. 12, Dec. 2012, pp. 3327-3333, 7 pages.

Wataru Saito et al., "Recessed-Gate Structure Approach Toward Normally Off High-Voltage AlGaN/GaN HEMT for Power Electronics Applications", IEEE Transactions on Electron Devices, vol. 53, No. 2, Feb. 2006, pp. 356-362, 7 pages.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005, pp. 435-437, 3 pages.

* cited by examiner

STATE OF THE ART

STATE OF THE ART

III-V DEPLETION MODE SEMICONDUCTOR DEVICE

FIELD OF THE DISCLOSURE

The present disclosure relates to semiconductor devices. Particularly, but not exclusively, the disclosure relates to hetero-structure AlGaN/GaN high electron mobility transistors or rectifiers.

BACKGROUND OF THE DISCLOSURE

Gallium Nitride (GaN) is a wide band gap material with properties that make it a suitable candidate for use in several fields of application (e.g. radio-frequency electronics, optoelectronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

In the last decade, Gallium Nitride (GaN) has increasingly been considered as a very promising material for use in the field of power devices. The application areas range from portable consumer electronics, solar power inverters, electric vehicles, and power supplies. The wide band gap of the material ($E_g$=3.39 eV) results in high critical electric field ($E_c$=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1e$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures and use of a p-type cap layer. Due to the relative maturity and controllability in the epitaxial growth of pGaN layers compared to the other techniques, pGaN/AlGaN/GaN HEMTs are currently the leading structure for commercialization.

FIG. 1 shows schematically a cross section of the active area of a pGaN HEMT, according to the state of the art. The device includes an AlGaN layer 1, a GaN layer 2, a transition layer 3, a silicon substrate 4, a substrate terminal 5, a SiO$_2$ passivation 6, a source terminal 8, a drain terminal 9, a gate terminal 10, and a highly p-doped GaN cap 11. The device shown is a lateral three-terminal device with an AlGaN/GaN heterostructure grown epitaxially on a standard silicon wafer. The transition layer 3 is used to allow a high quality GaN layer 2 to be grown despite the significant lattice mismatch between GaN 2 and Si 4. Carbon p-type doping is often added in the GaN layer. Finally, a thin cap GaN layer is typically added to form the gate with a Magnesium (Mg) p-type doping density greater than 1×10$^{19}$ cm$^{-3}$. A typical pGaN gate device has a threshold voltage of ~1.5-2V and gate turn-on bias voltage of ~8V.

While an enhancement mode device is used in some power electronic applications as the main power switch, there are numerous applications where a depletion mode device can be more suitable. In general, a depletion mode AlGaN/GaN transistor is made by placing a Schottky metal contact 12, which acts as the gate terminal, directly on the AlGaN layer 1 (excluding the p-GaN cap layer which exists in the enhancement mode devices) as seen in FIG. 2.

In state-of-the-art devices there is a trend to integrate a greater number of functions and devices, such as transistors, into a single chip to fabricate smaller, smarter, and more powerful systems. The combination and integration of enhancement and depletion mode transistors is a key enabler for advanced logic, analog and digital circuits.

In state-of-the-art depletion mode Schottky gate devices the threshold voltage of the device (i.e. the gate bias voltage at which the device is considered to move from the on-state to the off-state and vice versa) is dependent on process parameters such as, but not limited to, the AlGaN layer thickness, aluminium mole fraction and gate metal stack. Therefore to adjust the threshold voltage to a level which is most suitable for a specific application would require a change in the epitaxial growth and/or the gate metal processing, which is time consuming and expensive. The ability to reliably adjust the device threshold voltage through layout modifications would be significantly less time consuming and more cost efficient in comparison. Such capability does not currently exist in the state-of-the-art.

State-of-the-art depletion mode devices in the on-state have a limit on the maximum positive gate bias voltage which can be applied on the gate terminal before the main on-state conduction path (i.e. low resistance path) changes from drain-source to gate-source. This maximum bias voltage depends on the Schottky barrier height present at the gate contact and does not exceed 2V. A normally-on HEMT device which can be biased beyond this voltage level does not exist in the state-of-the-art.

US 2014/042452 and US 2014/015591 suggest using a depletion mode HEMT in the gate connection to limit overvoltage.

US 2015/076563 relates to a conventional normally-on HEMT with p-GaN islands on AlGaN placed in the same direction as the current flow, between the source and drain terminal. The p-GaN islands are provided alongside the drift region, in the same direction of the current flow between the source and the drain. The p-GaN islands cannot be used to control the threshold voltage of a device.

SUMMARY

It is an object of the present disclosure to provide a normally-on, depletion mode AlGaN/GaN HEMT, preferably featuring two threshold voltages.

The devices of the disclosure are advantageous over state-of-the-art devices for the following reasons:

The proposed device enables the control of the device threshold voltage (the first threshold voltage) through adjustments in the layout design of the transistor rather than only adjustments in epitaxial growth or the gate metal stack. Layout re-design leads to an optimized device at a much lower cost/effort than the other methods currently available such as change in the epitaxial growth and/or the gate metal processing.

The proposed device may be a normally-on depletion mode device where an increased positive gate bias voltage can be applied (>7V) before the main on-state conduction channel changes from drain-source to gate-source. Currently in state-of-the-art devices the voltage at which gate turn-on occurs is typically between 0.7V to 2V. At a higher positive gate terminal bias with respect to the source terminal, the proposed device can achieve an increased carrier density in the channel directly beneath the gate terminals. This reduces the overall on-state resistance and therefore reduces losses of the device.

The proposed depletion mode device may be fabricated in a fabrication process which normally does not offer the possibility of forming a depletion mode device, as the proposed device does not specifically need a Schottky contact which would have to be formed in a separate process. For example, both an enhancement mode and the proposed depletion mode device can be manufactured within the same fabrication process, therefore facilitating integration of an enhancement mode device with a depletion mode device.

The device can have a second threshold voltage, above which the device delivers a steeper current increase with the gate-source voltage. The second threshold voltage could be at the same level as that of a normally-off transistor integrated (or that could be integrated) within the same chip and containing a continuous p-GaN layer. The level of steepness (or softness) can be easily adjusted by layout, by controlling the ratio between the combined area of the p-GaN islands and the combined area of the regions between the p-GaN islands. Therefore, the device can be used as a two level actively modulated transistor featuring different on-state resistance levels.

The use of the proposed device can enable increased integration of auxiliary electronics (e.g. a start-up circuit in a power supply, integrated logic, digital or analog circuit) with the main power switch. This integration allows a reduction in the overall system size/costs and can lead to improved performance through the reduction of parasitic components associated with the interconnections between discrete devices.

According to a first aspect of the present disclosure, there is provided a depletion mode III-nitride semiconductor based heterojunction device, comprising: a substrate; a III-nitride semiconductor region formed over the substrate, wherein the III-nitride semiconductor region comprises a heterojunction comprising at least one two-dimensional carrier gas; a first terminal operatively connected to the III-nitride semiconductor region; a second terminal laterally spaced from the first terminal in a first dimension and operatively connected to the III-nitride semiconductor region; at least two highly doped semiconductor regions of a first conductivity type formed over the III-nitride semiconductor region, the at least two highly doped semiconductor regions being formed between the first terminal and the second terminal; and a gate terminal formed over the at least two highly doped semiconductor regions; wherein the at least two highly doped semiconductor regions are laterally spaced from each other in a second dimension.

The highly doped semiconductor regions (islands) may be placed on the semiconductor surface of the heterojunction and at zero gate-source terminal bias they create a depletion of the conductive channel (2D carrier gas) directly under it. This 2D carrier gas is of a second conductivity type. An uninterrupted channel may be present at zero gate-source bias between the first (source) and second (drain) terminals along the paths where the highly doped semiconductor regions are not present (in the 2D carrier gas formed under the region between the islands). This uninterrupted channel is present as long as the gate-source bias is greater than the first threshold voltage.

With a more negative bias applied to the gate terminal with respect to the source terminal, the carrier concentration in the conductive channel (region) between the drain and source terminals may be reduced due to an electric field extending from the highly doped islands to the regions between the islands. This lateral electric field depletes the 2D carrier gas formed under the regions between highly doped semiconductor islands and thus obstructs the current path through the 2D carrier gas, increasing the resistance between the source (first terminal) and the drain (second terminal). The critical gate bias value at which the device is considered to move from the on-state (low resistance) to the off-state is defined as the first threshold voltage or the device threshold voltage. Note that instead of applying a negative potential to the gate with respect to the source terminal, it may also be possible to keep the gate grounded and apply a positive potential to the source with the same result.

Each of the highly doped semiconductor regions may be spaced from the nearest other highly doped semiconductor region. The threshold voltage may be controlled by the separation between adjacent highly doped islands, layer thicknesses, and doping fractions. The specific on-state resistance of the device according to this invention may be controlled by the number of separations between highly doped islands and the length of the highly doped islands with respect to the separation between the islands.

The at least two highly doped semiconductor regions may comprise discrete regions, wherein each of the at least two highly doped semiconductor discrete regions may be separated from the nearest other highly doped semiconductor regions by a predetermined distance. The discrete regions (or discontinuous islands) may be formed such that between adjacent discrete regions (islands) there is no highly doped semiconductor layer present, and as such, there is a direct, unobstructed conductive path between the first terminal (source) and the second terminal (drain), provided by an un-depleted Two Dimensional carrier gas layer. Adjacent islands may be placed close together in a line across (and orthogonal to) the current path, such that the potential applied to the gate modulates the conductive region (i.e. the portion of the 2D carrier gas layer) between the islands and thus modulates the direct path between the source and the drain.

The device may have two threshold voltages. The first threshold voltage may be negative and may be equivalent to that of a classical normally-on transistor, indicating the transition from the off-state to the on-state. Preferably, the second threshold voltage may be positive and may be characterised by a steep current increase. The second threshold voltage can occur at the same value as that of an integrated normally-off device featuring a continuous gate made of a highly doped semiconductor region (pGaN gate in the case of a two dimensional electron gas HEMT).

When the gate voltage is very negative, the adjacent highly doped semiconductor islands deplete the portion of the 2D carrier gas between them, obstructing the path for carriers to flow from the source to drain. Once the gate-source voltage is equal or greater than the first threshold voltage, the 2D carrier gas starts forming at the middle of the pitch between adjacent highly doped semiconductor regions. At this stage a conductive path is established between the source and drain. The value of the first threshold voltage can be adjusted by controlling the pitch between adjacent highly doped semiconductor islands. As the gate-source voltage is increased above the first threshold voltage but remaining below the second threshold voltage, the formation of the 2D carrier gas channel spreads from the middle of the pitch between adjacent highly doped semiconductor islands towards the edges of the highly doped semiconductor gate islands. The current continues to increase as the on-state resistance is reduced. When the second threshold voltage (which is preferably positive) is reached, a steep increase in the current is seen as the 2D carrier gas spreads directly under the highly doped semiconductor islands allowing the current to flow through these additional regions, thus resulting in an increase in the conduction area. This is characterised by a steep increase in current and, as a result, a steep decrease in the on-state resistance. The rate of the current increase depends on the ratio between the width of the highly doped semiconductor islands and the pitch between them.

Preferably, the starting substrate may be silicon. However, any other substrate combining silicon with another semiconducting material compatible with state-of-the-art fabrication processes may be used. Employment of a silicon substrate facilitates etching techniques, low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The semiconductor layers forming any of the heterostructures included in this disclosure may be formed using any one of Metal-Organic Chemical Vapour Deposition (MOCVD) and Molecular Beam Epitaxy (MBE) growth techniques. Other alternative growth techniques may also be possible.

The heterojunction of the III-nitride semiconductor region may comprises: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas formed at the interface between the first and second III-nitride semiconductor layers to provide a channel.

The first III-nitride semiconductor layer may comprise any one of gallium nitride (GaN), aluminium gallium nitride (AlGaN) and indium aluminium gallium nitride (InAlGaN); and the second III-nitride semiconductor layer may comprise any one of gallium nitride (GaN), aluminium gallium nitride (AlGaN) and indium aluminium gallium nitride (InAlGaN).

The heterostructure may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructure will be an AlGaN/GaN heterostructure comprising a two dimensional electron gas (2D carrier gas); this will be used for illustrative purposes in the embodiments hereafter and in the accompanying drawings. GaN and AlGaN technology allows transistors with high electron mobility and high saturation velocity to be designed.

The at least one two dimensional carrier gas may be a two dimensional electron gas (2DEG) or a two dimensional hole gas (2DHG). The 2DEG has a considerably higher carrier mobility and is therefore preferred to a 2DHG.

The at least two highly doped semiconductor regions may be in contact with the III-nitride semiconductor region. Preferably, the at least two highly doped semiconductor regions may be in contact with the second III-nitride semiconductor layer of the III-nitride semiconductor region.

The first dimension defined by the current flow may be perpendicular to the second dimension defined as the placement of islands. Therefore, the highly doped semiconductor regions, and the spaces between adjacent highly doped semiconductor regions, are formed between the source and the drain terminal.

The at least two highly doped semiconductor regions may comprise a p-type gallium nitride (pGaN) material. The pGaN forms a barrier with the AlGaN material underneath. The high doping of the pGaN facilitates a depletion region to penetrate the AlGaN layer all the way to the 2DEG, function of the potential applied to the gate terminal with respect to the source terminal. Hole tunnelling occurs from the gate terminal into the semiconductor when the potential on the gate is increased. A certain amount of hole current through the gate has a positive effect on the stability of the device during dynamic high voltage stress, but if the current is too high this is seen as leakage in the control terminal affecting the driver and the total losses of the device.

The device may further comprise a transition layer formed between the substrate and the III-nitride semiconductor region. The transition layer may be present between the heterostructure and the bulk substrate to minimise the lattice mismatch or accommodate the mechanical stress in the heterostructure. The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}/Al_yGaN_{1-y}N$ (y being the aluminium mole fraction of the compound) creating a multilayer stack, also known as superlattice.

The at least two highly doped semiconductor regions may be aligned in the first dimension. In other words, the at least two highly doped semiconductor regions may form a line of highly doped semiconductor regions extending in the second dimension, in a different, perpendicular direction to the current flow between the first terminal and the second terminal.

The device may be a normally-on device (as the first threshold voltage is negative), but may be characterised by a second steep increase in the current when the second threshold voltage is reached.

The device according to this disclosure can be monolithically integrated with other high voltage or low voltage normally-off devices. Such normally-off devices may use a continuous highly doped semiconductor layer for the gate structure. The highly doped semiconductor layers in the continuous and discontinuous gate transistors can be manufactured in the same process step and the difference between continuous and discontinuous highly doped semiconductor layers may be realized by a layout change of the same mask. Furthermore, the threshold voltage of the normally-off device (featuring a continuous layer) may be the same as that of the second threshold voltage of the normally-on device. This is because, if the same pGaN process layer is used in both devices, one expects that the same gate-source voltage is needed to allow a 2D carrier gas to form underneath.

The gate terminal (and the metal track associated with the gate terminal) may extend in a third dimension between one of the at least two highly doped semiconductor regions and the nearest other highly doped semiconductor region.

The at least two highly doped semiconductor regions may comprise a first plurality of highly doped semiconductor regions and a second plurality of highly doped semiconductor regions. The first plurality of highly doped semiconductor regions may comprise at least two highly doped semiconductor regions aligned in the first dimension and laterally spaced in the second dimension. The second plurality of highly doped semiconductor regions may also comprise at least two highly doped semiconductor regions aligned in the first dimension and laterally spaced in the second dimension. The first plurality of highly doped semiconductor regions and the second plurality of highly doped semiconductor regions may be laterally spaced from each other in the first dimension. In other words, there may be at least two rows of highly doped semiconductor regions formed on the III-nitride semiconductor region. The second or third row of such highly doped semiconductor regions are provided in order to facilitate the depletion of the 2D carrier gas between the islands in the first row. This allows a lower absolute value of the negative threshold voltage (a negative value closer to 0V) for the same pitch (spacing) between the islands.

The at least two highly doped semiconductor regions of the first plurality of highly doped semiconductor regions may be offset in the second dimension from the at least two highly doped semiconductor regions of the second plurality of highly doped semiconductor regions. In other words, the gaps between highly doped regions in the first plurality may be aligned with highly doped regions of the second plurality. The highly doped regions of the first plurality may be misaligned in the second dimension from the highly doped regions of the second plurality. This is done in order to facilitate the depletion of the 2D carrier gas between the islands in the first row. The electric field which is responsible for depletion of the 2D carrier gas is now present not only in the vicinity of the islands from the same row, but by adjacent islands from the other rows. The electric field is now three-dimensional and as a result the depletion of the 2D carrier gas is more effective leading to a lower absolute value of the negative threshold voltage (a negative threshold value closer to 0V).

The gate terminal may be operatively connected to all of the at least two highly doped semiconductor regions. In embodiments where there are at least two pluralities of highly doped semiconductor regions, the gate terminal may be in contact with each of the pluralities of highly doped semiconductor regions, thus creating an effective contour of electric field which helps with the depletion of the 2D carrier gas in the regions between highly doped semiconductor regions.

The active gate region may have any of a circular, rectangular, oval, square, triangular, or other polygon shape. The transistor can have an interdigitated architecture or a multi-cell architecture based on geometrical shapes such as square, circles or hexagons.

The active gate terminal may comprise an Ohmic contact. Alternatively, the active gate terminal may comprise a Schottky contact. The Schottky contact has the advantage of smaller gate leakage currents, while the Ohmic contact is beneficial to increase stability of the device, and to passivate traps in the AlGaN and GaN buffers by hole injection.

The at least two highly doped semiconductor regions of a first polarity may each have any of a circular, rectangular, oval, square, triangular, or other polygon shape. The highly doped semiconductor regions may be patterned as a series of rectangles arranged in a line. Alternatively, the semiconductor regions may be patterned as a series in a hexagonal pattern, a square/rectangular pattern or any other arrangement. The highly doped semiconductor regions may each be a circle, square, triangle, a trapezoid, rectangle, cross, or any other shape. The periodicity may be constant from highly doped semiconductor region to highly doped semiconductor region (i.e. the same distance between each highly doped semiconductor region). Alternatively, it can vary in a periodic manner.

Preferably, the distance between adjacent highly doped semiconductor regions may be less than 1000 nm. More preferably, the distance between adjacent highly doped semiconductor regions may be less than 500 nm.

The device may be configured to operate as a high electron mobility transistor.

The device may be configured to operate as a diode. Preferably, the active gate region may be operatively connected to the first (source) terminal. Alternatively, the active gate region may be operatively connected to the second (drain) terminal. The diode could be used as an anti-parallel device in conjunction with a normally-off power switch transistor. The diode could conduct current in the reverse direction to that of the power switch. The diode could be further used as a free-wheeling diode.

Several such power switches (normally-off transistors) and normally-on transistors configured as anti-parallel diodes could be monolithically integrated. One example is a half bridge configuration where one power switch is operated in the low-side and the other power switch is operated in the high side. Each of these power switches could feature an anti-parallel normally-on transistor configured as diode. Other configurations such as full bridges or multiple half-bridges are possible.

According to a further aspect of the disclosure, there is provided a circuit comprising the heterojunction depletion mode (normally-on) device as previously disclosed, wherein the heterojunction depletion mode (normally-on) device may be configured to operate as a high electron mobility transistor. The heterojunction normally-on device may be configured to operate as a normally-on depletion mode low power device. Alternatively, the heterojunction normally-on device may be configured to operate as a normally-on depletion mode power or high voltage device. The heterojunction device may be configured to operate in a circuit, for example a NAND gate, as auxiliary electronics with a main power switch, or analog circuits such as current limiters, linear regulators, current sources, overvoltage protection, or voltage followers. It can also be configured to work as a start-up circuit, and may preferably be integrated monolithically with a normally-off power switch.

According to a further aspect of the present disclosure, there is provided a method of manufacturing a III-nitride semiconductor based heterojunction device, the method comprising: forming a substrate; forming a III-nitride semiconductor region formed over the substrate, wherein the III-nitride semiconductor region comprises a heterojunction comprising at least one two-dimensional carrier gas of the second conductivity type; forming a first terminal operatively connected to the III-nitride semiconductor region; forming a second terminal laterally spaced from the first terminal in a first dimension and operatively connected to the III-nitride semiconductor region; forming at least two highly doped semiconductor regions of first conductivity type formed over the III-nitride semiconductor region, between the first terminal and the second terminal, wherein the at least two highly doped semiconductor regions are laterally spaced from each other in a second dimension; and forming a gate terminal formed over the at least two highly doped semiconductor regions.

BRIEF DESCRIPTION OF THE DRAWINGS

Some preferred embodiments of the disclosure will now be described by way of example only and with reference to the accompanying drawings, in which.

DETAILED DESCRIPTION OF THE PREFERRED EMBODIMENTS

The present disclosure will be understood more fully from the accompanying drawings, which however, should not be taken to limit the disclosure to the specific embodiments shown, but are for explanation and understanding only.

Figure 1:
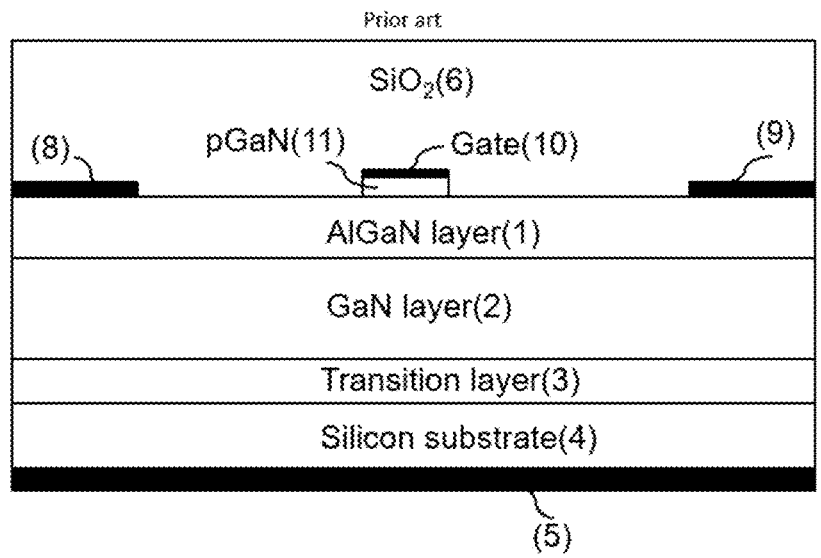
FIG. 1 shows a schematic cross section of the active area of a pGaN HEMT, according to the state-of-the-art.
Figure 2:
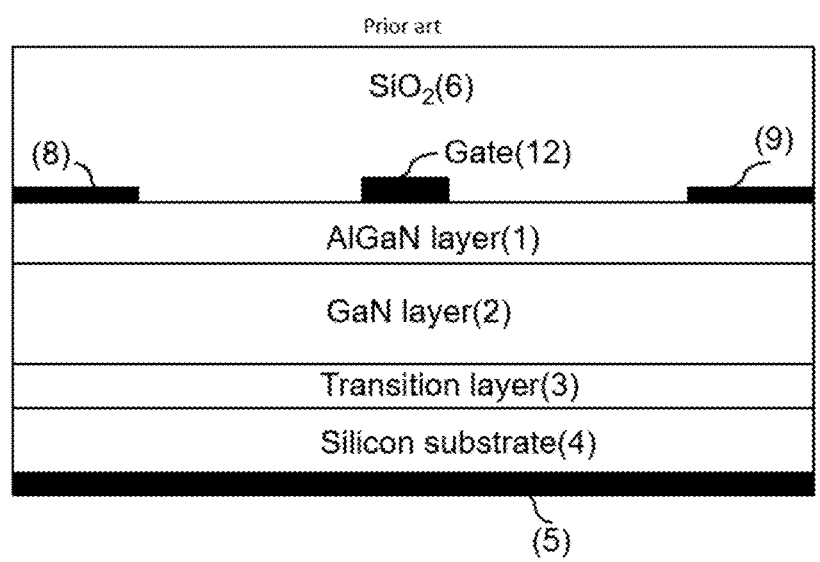
FIG. 2 shows a schematic cross section of the active area of a state-of-the-art depletion mode HEMT with a Schottky gate terminal.
Figure 3:
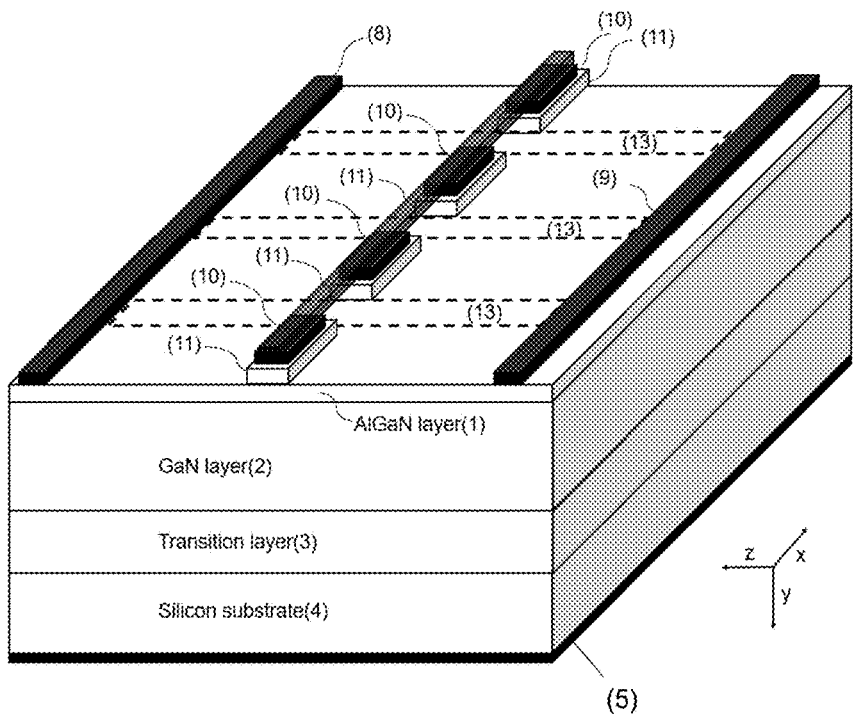
FIG. 3 shows a schematic perspective view of a device according to an embodiment of the present disclosure.

FIG. 3 shows a schematic perspective view of the active area of a GaN based semiconductor device according to an embodiment of the present disclosure. The device is presented in three dimensions: a first dimension (z-direction), a second dimension (x-direction) and a third dimension (y-direction).

In this embodiment, the device comprises a semiconductor (e.g. silicon) substrate 4 defining a major (horizontal) surface at the bottom of the device. It will be appreciated that any other substrates for GaN devices can be used. Examples of alternative substrate material are Sapphire, Silicon Carbide, and GaN.

Below the substrate 4 there is a substrate terminal 5. The device includes a transition layer 3 formed on top of the semiconductor substrate 4. The transition layer 3 comprises a combination of III-V semiconductor materials acting as an intermediate step to allow the subsequent growth of regions of high quality III-V semiconductor materials. The transition layer, also known as a buffer layer, 3 may comprise a single layer of $Al_xGaN_{1-x}N$ (with x varying between 0 and 1) or any composition of $Al_xGa_{1-x}N$/GaN creating a multilayer stack. It will be appreciated that the buffer layer 3 may not be used in the device, particularly when the substrate 4 is not Si.

On top of the transition layer 3 there is formed a semiconductor region. The semiconductor region comprises several layers. A first semiconductor layer 2 is of high quality III-V semiconductor (for example GaN) and this may comprise several layers itself. The GaN semiconductor layer 2 is grown on top of the buffer 3/substrate 4 stack using a suitable growth technique. Examples of these are Metal-Organic Chemical Vapour Deposition (MOCVD) and Molecular Beam Epitaxy (MBE).

A further semiconductor layer 1 of III-V semiconductor containing a mole fraction of Aluminium is formed on top of the first semiconductor layer 2. The AlGan layer 1 is formed such that a hetero-structure is formed at the interface between the GaN layer 2 and the AlGaN layer 1 resulting in the formation of a two dimensional electron gas (2DEG).

A high voltage drain terminal 9 is arranged in physical contact with the AlGaN layer 1. The high voltage drain terminal 9 forms an Ohmic contact to the 2DEG. A low voltage source terminal 8 is also arranged in physical contact with the AlGaN layer 1 and also forms an Ohmic contact to the 2DEG. The drain 9 and source 8 terminals consist of Ohmic metal contacts on the surface of AlGaN layer 1 or directly in contact with a good electrical connection to the 2DEG.

Regions of highly p-doped III-V semiconductor 11 are formed in contact with the AlGaN semiconductor layer 1. These have the function of reducing the 2DEG carrier concentration under the highly doped regions 11 when the device is unbiased, and are formed of highly p-doped GaN (pGaN) material in this embodiment. The pGaN regions 11 are discrete regions and are spaced from each other in the 2nd dimension (the x-direction). The pGaN regions 11, also known as pGaN islands 11, extend in the x-direction in a discontinuous line. The highly p-doped GaN regions 11 may be Magnesium (Mg) doped. The highly p-doped GaN regions 11 extend along an axis which is perpendicular to the axis connecting the source terminal 8 and the drain terminals 9, where the current flows. The p-GaN layer 11 in the discontinuous gate structure of the present disclosure may be manufactured in the same process step as a continuous p-GaN layer. The difference between continuous and discontinuous p-GaN layers is realized by a layout change of the same mask.

A gate control terminal 10 is configured over the highly doped regions 11 in order to control the carrier density of the 2DEG at the interface of the semiconductor layers 1, 2. All the pGaN islands 11 are connected to the same gate electrode 10. The gate terminal 10 consists of metal contacts placed on the intermittent regions of the p-GaN islands 11. The electrical connection between the high voltage terminal (drain) 9 and the low voltage terminal (source) 8 is determined by a voltage signal applied on the third terminal (gate) 10 with respect to the low voltage terminal (source) 8. The gate control terminal 10 can be either an Ohmic contact or a Schottky contact.

The 2DEG is formed along the interface between the GaN layer 2 and the AlGaN layer 1. The gate structure of a discontinuous p-GaN layer containing islands 11 within a stripe modulates the conductive path between the high voltage drain terminal 9 and the low voltage source terminal 8, when a gate voltage is provided. By discontinuous islands, it is meant that between adjacent islands 11 there is no p-GaN layer present, and as such, there is a direct, unobstructed conductive path 13 between the source terminal 8 and the drain terminal 9. However, adjacent islands 11 within a stripe or line of islands are placed close enough together across (and orthogonal to) the current path 13 such that the potential applied to the gate terminal 10 modulates the conductive region 13 between the islands 11 and thus modulates the direct path between the source 8 and the drain 9.

The conductive channel between the drain terminal 9 and the source terminal 8 is a two-dimensional electron gas which is formed at the interface of the AlGaN/GaN heterostructure 1, 2. The p-doped GaN islands 11 are placed on the AlGaN surface 1 of the heterojunction and at zero gate terminal bias create a depletion of the conductive channel (2DEG) under the heterojunction. An uninterrupted channel is present at zero bias between the source terminal 8 and the drain terminal 9 along the paths 13 where the p-doped GaN layer 11 is not present (between the islands 11). At zero bias the conduction channel is present in regions where the p-GaN layer 11 is not present vertically above.

When negative bias is applied to the gate terminal 10 with respect to the source terminal 8, the carrier concentration in the conductive channel (region) between the drain terminal 9 and the source terminal 8 is reduced due to the lateral electric field extending from the p-doped GaN islands 11 to the regions between the islands. The lateral electric field is formed in the x-direction, perpendicular to the axis connecting the source 8 and drain 9 terminals. This lateral field depletes the 2DEG and thus increases the 2DEG resistance between the source 8 and the drain 9. The critical gate bias value at which the device is considered to move from the on-state (low resistance) to the off-state (high resistance) is defined as the first threshold voltage. Note that instead of applying a negative potential to the gate 10, it is also possible to keep the gate 10 grounded and apply a positive potential to the source 8 to achieve the same result. Channel modulation such that the device operates as a transistor is achieved through the lateral JFET depletion of the conductive channel in the regions where the p-GaN islands 11 are not placed vertically above, when the gate terminal 10 is increasingly negatively biased.

Parameters which affect the first threshold voltage value include (but are not limited to) the separation between p-doped GaN islands 11, AlGaN layer 1 thickness and aluminium mole fraction of the AlGaN layer 1. Other parameters which affect the specific on-state resistance of the depletion mode transistors are the number of separations between p-doped GaN islands 11 and the width of the p-doped GaN islands 11 with respect to the pitch (separation) between the islands.

As the gate-source voltage is increased above the first threshold voltage but remaining below the second threshold voltage, the formation of the 2DEG channel spreads from the middle of the pitch between adjacent pGaN islands 11 towards the edges of the pGaN gate islands 11. The current continues to increase as the on-state resistance is reduced.

The device features a second threshold voltage which is higher (more positive) than the first threshold voltage. The signature of the second threshold voltage is that of a steep current increase. This second threshold voltage level corresponds to the formation of the 2DEG directly under the p-GaN islands 11 rather than between the islands. A steep increase in the current is seen as the 2DEG spreads under the p-gate islands 11 allowing the current to flow through this region, thus resulting in an increased conduction area. The steepness (or softness) of the current at the second threshold voltage and above the second threshold voltage is reached depends on the ratio between the combined area of the p GaN islands 11 and the combined area of the regions between the p-GaN islands (separations). The higher this ratio is the sharper (the steeper) the current increase. If the ratio is low, the current increase, when the second threshold voltage is reached, is smoother. As a result of the steep increase in current there is a steep decrease in the on-state resistance.

The device is a depletion mode GaN device where the device threshold voltage can be adjusted through layout modifications in addition to epitaxy/process modifications. The device is therefore a normally-on device (as first threshold voltage is negative), but is characterised by a second steep increase in the current when the second threshold voltage is reached. Furthermore, the normally-on, depletion mode device according to this disclosure can allow for an increased positive gate bias voltage to be applied (>7V) before the main on-state conduction channel changes from drain-source to gate-source.

Figure 4A:
FIG. 4A shows a schematic top view of a device according to an embodiment of the present disclosure.

FIG. 4A shows a schematic top view of a device according to the embodiment of the present disclosure shown in FIG. 3. This figure shows the device in two dimensions: a first dimension (z-direction) and a second dimension (x-direction). Many of the features of this figure are the same as those shown in FIG. 3 and therefore carry the same reference numerals.

Figure 4B:
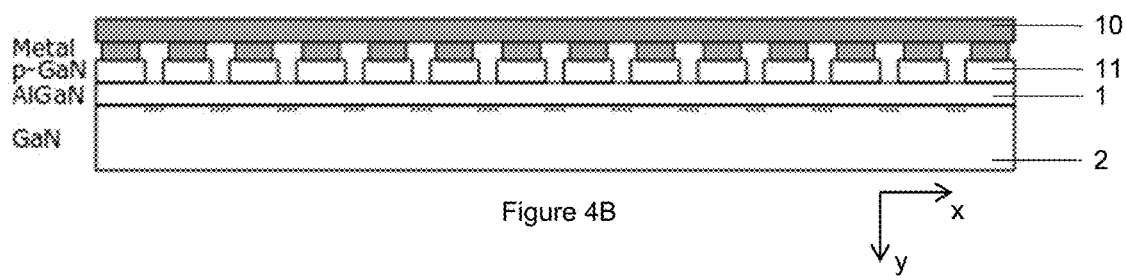
FIG. 4B shows a schematic cross section of the device shown in FIG. 4A.

FIG. 4B shows a schematic cross section of the active area of the device shown in FIG. 4A, along the cutline shown in FIG. 4A. This figure shows the device in two dimensions: a second dimension (x-direction) and a third dimension (y-direction).

Figure 5:
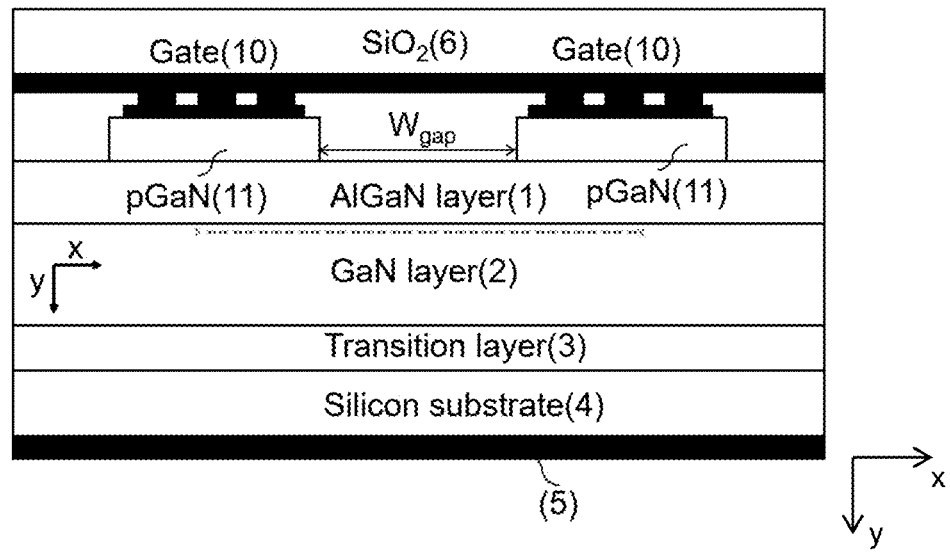
FIG. 5 shows a schematic cross-section along the gate terminal of the device according to an embodiment of the present disclosure.

FIG. 5 shows a schematic cross-section along the gate terminal of the device according to an embodiment of the present disclosure. This figure shows the device in two dimensions: a second dimension (x-direction) and a third dimension (y-direction). Many of the features of this figure are the same as those shown in FIG. 3 and therefore carry the same reference numerals.

Figure 6:
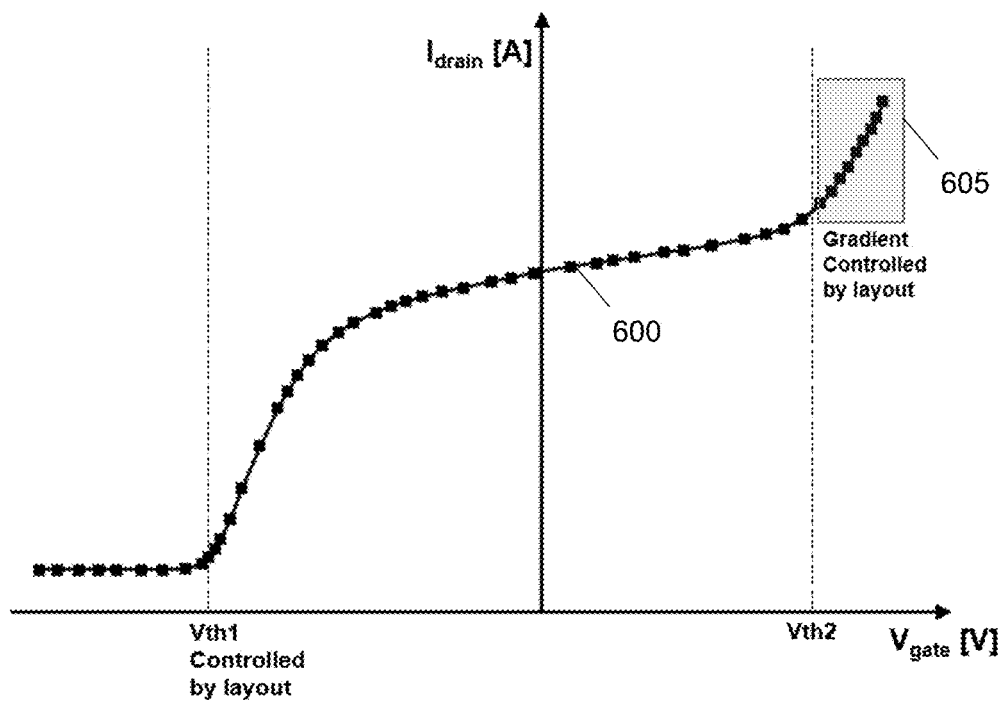
FIG. 6 shows the transfer characteristic of the proposed device.

FIG. 6 shows the steady-state transfer characteristics 600 of the device where the two threshold voltages are clearly identified as Vth1 and Vth2. The second threshold voltage, Vth2, is higher (more positive) than the first threshold voltage, Vth1. The signature of the second threshold voltage, Vth2, is that of a steep current increase. This second threshold voltage level, Vth2, corresponds to the formation of the 2DEG directly under the pGaN islands rather than between the islands. The steepness (or softness) of the current 600 when and after the second threshold voltage, Vth2, is reached depends on the ratio between the combined area of the pGaN islands and the combined area of the regions between the pGaN islands (separations). The higher this ratio is the sharper (steeper) the current increase. A kick in the current can be visible in this case, shown in region 605. If the ratio is low, the current increase, when the second threshold voltage is reached, is smoother.

Figure 7:
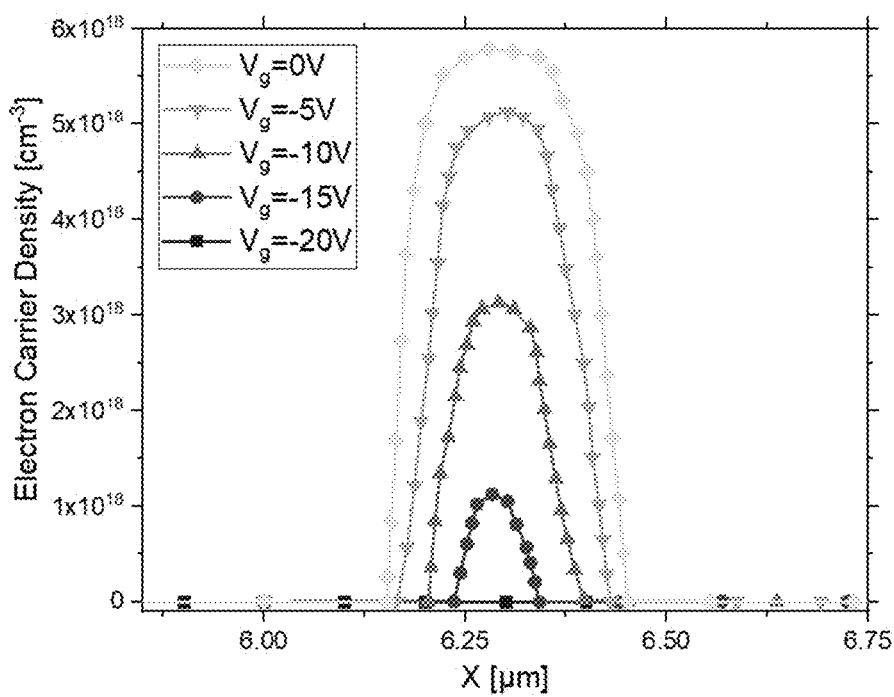
FIG. 7 shows a plot of the electron carrier density as a function of the gate terminal bias along the cutline defined in FIG. 5. This illustrates the depletion of the 2DEG as the gate terminal is negatively biased with respect to the source terminal.
Figure 8:
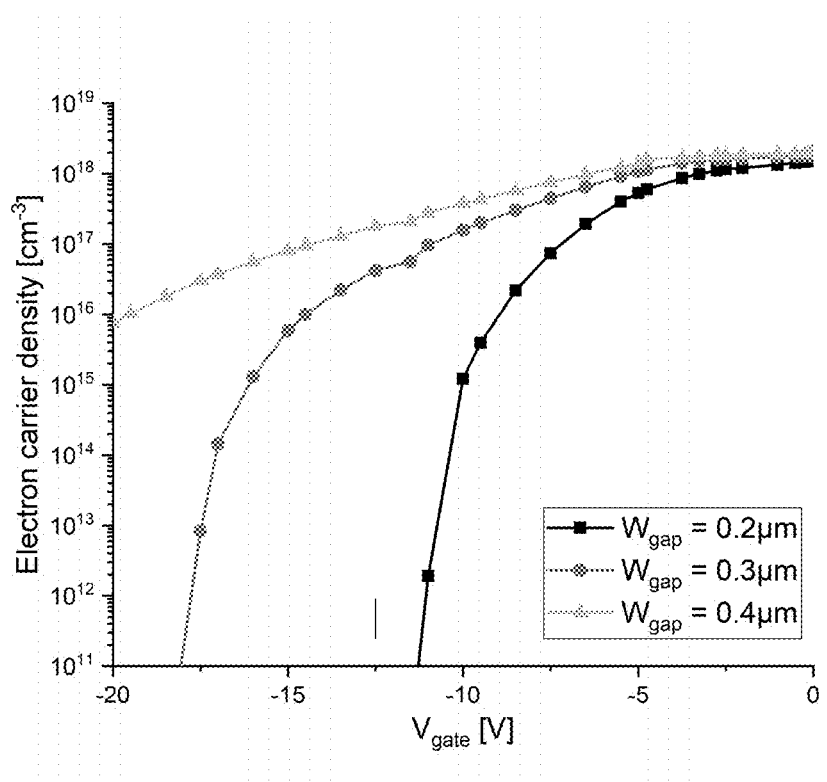
FIG. 8 shows a plot of the simulated electron carrier density at the midpoint between two adjacent pGaN regions as a function of the gate terminal bias.
Figure 9:
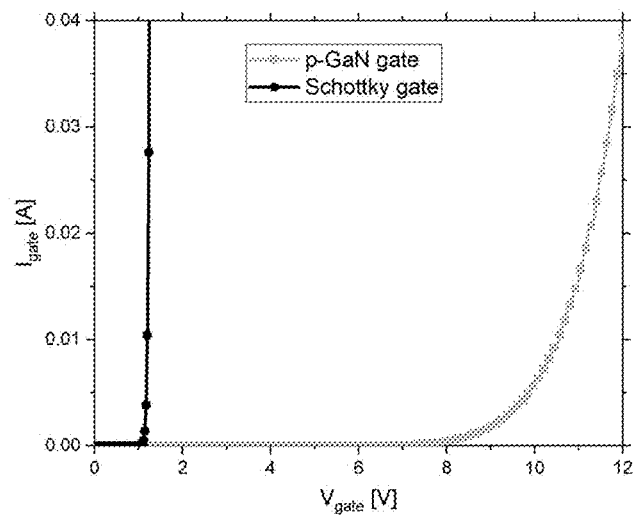
FIG. 9 shows a plot of a TOAD simulation comparing a conventional Schottky gate junction with a p-GaN gate of the device of the present disclosure.

FIGS. 7 to 9 show experimental results that demonstrate the basic functionality of the disclosed device. These were demonstrated using Sentaurus TOAD simulations. The model developed was a 3D reconstruction of the structure seen in FIG. 3.

FIG. 7 shows a plot of the electron carrier density as a function of the gate terminal bias along the cutline x-x shown in FIG. 5. In a depletion mode device, a strong conductive channel is present at zero bias which gradually depletes as the negative bias on the gate is increased. The source/drain contacts were set to 0V and the gate contact was increasingly negatively biased. The electron carrier density at the AlGaN/GaN interface in the region between the two gates was monitored along the x-axis, as shown by the cutline in FIG. 5. At zero bias, a high density of carriers was present in the region without a pGaN island vertically above, but a negligible carrier density was present in the region where a pGaN island exists. With increasing negative gate bias the depletion grows laterally from the p-doped regions on either side of the 2DEG. This illustrates the depletion of the 2DEG as the gate terminal is negatively biased.

This depletion grows laterally and eventually pinches off the channel between the two gates. The gate bias at which the 2DEG channel is fully depleted, and the device is off, can depend on several factors:

- The charge density in the 2DEG is (as well known in the field) dependent on the AlGaN/GaN interface charge, the AlGaN layer thickness, and the interface charges between AlGaN and passivation.
- The out-diffusion of Mg doping from the pGaN region into the AlGaN and GaN layers below.
- The distance between the adjacent p-GaN islands (shown as $W_{gap}$ in FIG. 5) as this will affect the electrostatic potential distribution in the region.

FIG. 8 shows a plot of the simulated 2DEG carrier density at the midpoint between two adjacent pGaN regions as a function of the gate terminal bias. This is shown for different values of separation between the two adjacent p-GaN islands. This is illustrates the effect that the separation between pGaN regions has on device threshold voltage. This figure demonstrates that the first threshold voltage of the device can be controlled through adjustments in the layout of the device rather than epitaxy/processing adjustments.

The device on-state resistance can also be varied independently of the threshold voltage by adjusting the width of the pGaN regions.

FIG. 9 shows a plot of a simulation comparing a conventional Schottky gate junction with a p-GaN gate of the device of the present disclosure. This illustrates the different gate bias at which a substantial current is drawn from the gate in a state-of-the-art Schottky gate device and the p-GaN gate used in the depletion mode device disclosed herein. This figure shows clearly that the proposed depletion mode device allows for an increased positive gate bias voltage (well above the second threshold voltage) to be applied (>7V) before the main on-state conduction channel changes from drain-source to gate-source.

Figure 10:
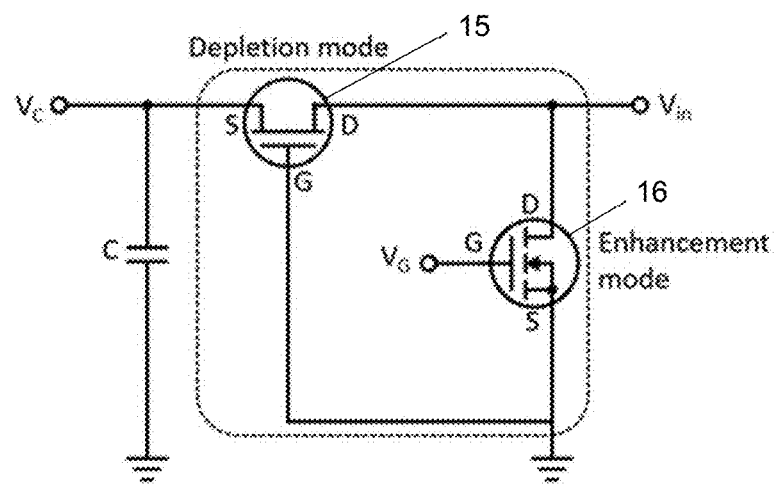
FIG. 10 shows schematically a DC/DC conversion electronic circuit which includes as a main component a depletion mode device according to an embodiment of the present disclosure.

FIG. 10 shows schematically a DC/DC conversion electronic circuit which includes as a main component a normally-on, depletion mode device 15 according to an embodiment of the present disclosure. A normally-on depletion mode HEMT is used to provide a low voltage, such as 5 V, from a high voltage. In the circuit shown in FIG. 10, the output voltage is given by the gate threshold voltage of the enhancement mode device 16. This is because the gate of the normally-on device is grounded and once the source potential is elevated to a potential equivalent to the absolute value of the threshold voltage, the normally-on device turns off, stopping the charging of the capacitor. The energy efficiency of this DC/DC conversion is very poor, and the losses will be high. Therefore, it can only be used for a short time or for small power. The voltage-drop between $V_{in}$ (e.g. 400 V) and $V_C$ (e.g. 5 V) is large, therefore the depletion mode transistor should have a comparable voltage rating as the main power switch. This setup can be very useful in applications such as a power supply for the logic part of the chip.

Figure 11:
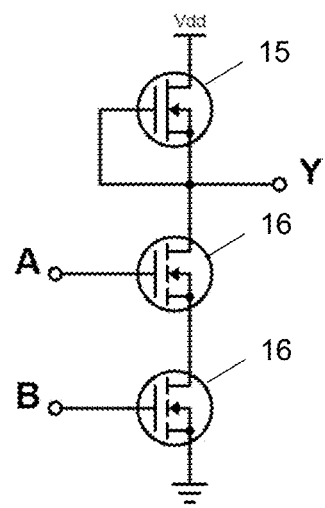
FIG. 11 shows schematically a NAND gate electronic circuit which includes as a main component a depletion mode device according to an embodiment of the present disclosure.

FIG. 11 shows schematically a NAND gate electronic circuit which includes as a main component a depletion mode device 15 according to an embodiment of the present disclosure. In this circuit, the depletion mode HEMT acts as a non-linear load resistor. A combination of enhancement mode HEMTs 16 (active) and depletion mode HEMTs 15 (load) is often used.

Figure 12:
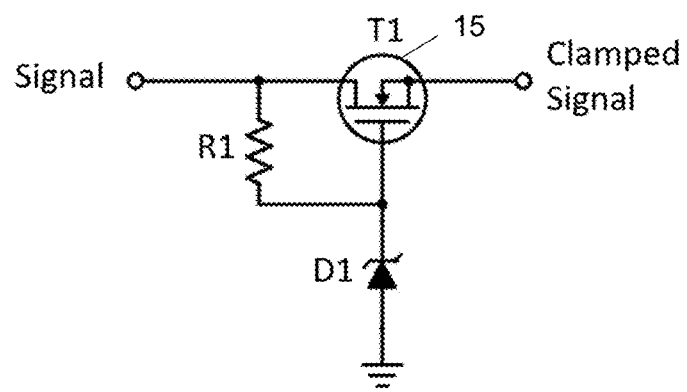
FIG. 12 shows schematically an overvoltage protection element as an example of an analog electronic circuit which uses a depletion mode HEMT according to an embodiment of the present disclosure.

FIG. 12 shows schematically an overvoltage protection element as an example of an analog electronic circuit which uses a depletion mode HEMT 15 according to an embodiment of the present disclosure.

Additionally, the depletion mode HEMT can be used for a variety of analog circuits, such as current limiters, linear regulators, current sources, overvoltage protection, or a voltage follower. These have in the past been implemented with depletion-mode Si MOSFETs in Silicon-based ICs.

The depletion mode device may be monolithically integrated with other semiconductor devices. The monolithic integration of the electronics shown in FIGS. 10 to 12 allows a reduction in the overall system size and costs as well as lower BOM (bill of material) and increased reliability. It also leads to improved performance through the reduction of parasitic components associated with the interconnections between discrete devices.

Figure 13:
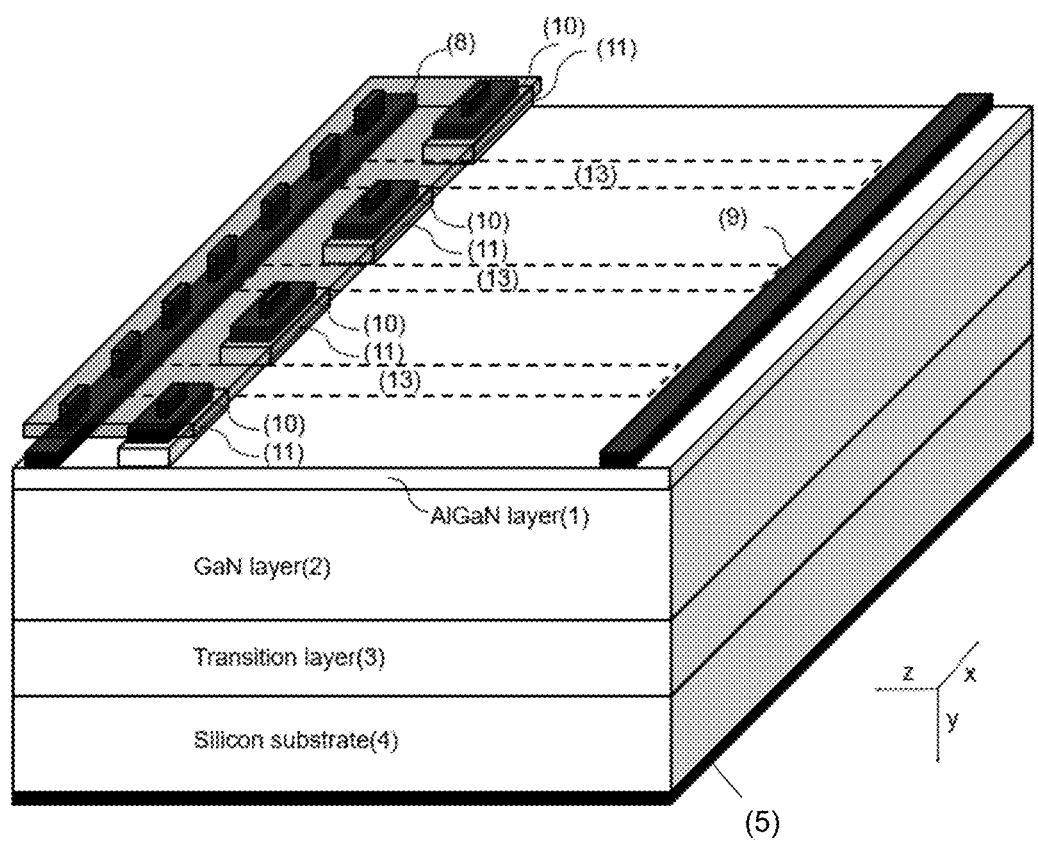
FIG. 13 shows a schematic perspective view of a device configured to operate in diode mode according to further embodiment of the disclosure.

FIG. 13 shows a schematic perspective view of a device configured to operate in diode mode, according to further embodiment of the disclosure. In this embodiment, the normally-on depletion mode transistor with discontinuous pGaN islands 11 is configured to be used in a diode mode, by connecting the gate 10 and source 8 together. This becomes the anode terminal of the diode, while the cathode terminal is given by the drain of the normally-on depletion mode transistor. Alternatively, because of the symmetry, this can be done by connecting the drain 9 and gate 10 together.

The distance (pitch) between the pGaN islands 11 can be used to adjust the voltage level at which the diode conducts current in the forward mode. This is particularly advantageous over the state-of-the-art devices where a continuous pGaN layer is used, which results in a large forward voltage. For example, the pitch between adjacent pGaN islands 11 (or adjacent pluralities of pGaN islands in embodiments of the device with multiple stripes of pGaN islands) can be used to adjust the opening forward voltage to be about 0.3V to 0.5V, which is specific to Schottky diodes in silicon. This opening forward voltage should be as small as possible to minimise on-state losses of the diode but greater than zero at all temperatures. 0.3V to 0.5V is therefore suitable for room temperature operation. To avoid a negative opening voltage, which is undesirable for a diode, the pitch between adjacent pGaN islands 11 in this embodiment should be very small (in the orders of tens or hundreds of nanometres).

Alternatively, to avoid a negative opening voltage, the anode terminal (which is made of the source and the gate of the normally-on device connected together) of the diode described above can have a Schottky contact to the 2DEG layer to prevent conduction in the reverse mode of the diode. The pGaN islands, 11 can serve as a shield, to avoid high electric fields to reach the source Schottky contact (the anode terminal of the diode) during the reverse blocking mode of the diode, when a high voltage is present on the cathode terminal with respect to the anode terminal. This in turn prevents high leakage currents in the reverse mode, leading to better blocking performance especially at high temperatures.

A second increase in the current is present at a higher voltage level (higher than the opening voltage level) during forward conduction, when the 2DEG under the pGaN layer 11 is formed. In order to minimise the on-state resistance in forward conduction, the diode may operate beyond the second threshold voltage.

The diode shown in this embodiment, with source 8 and gate 10 operatively connected to each other and with a drift region present between the drain side of the gate edge 10 and the drain terminal 9, can be used as a high voltage diode. The diode can also be used as a free-wheeling or anti-parallel diode and can also be monolithically integrated with a normally-off GaN based HEMT.

Figure 14A:
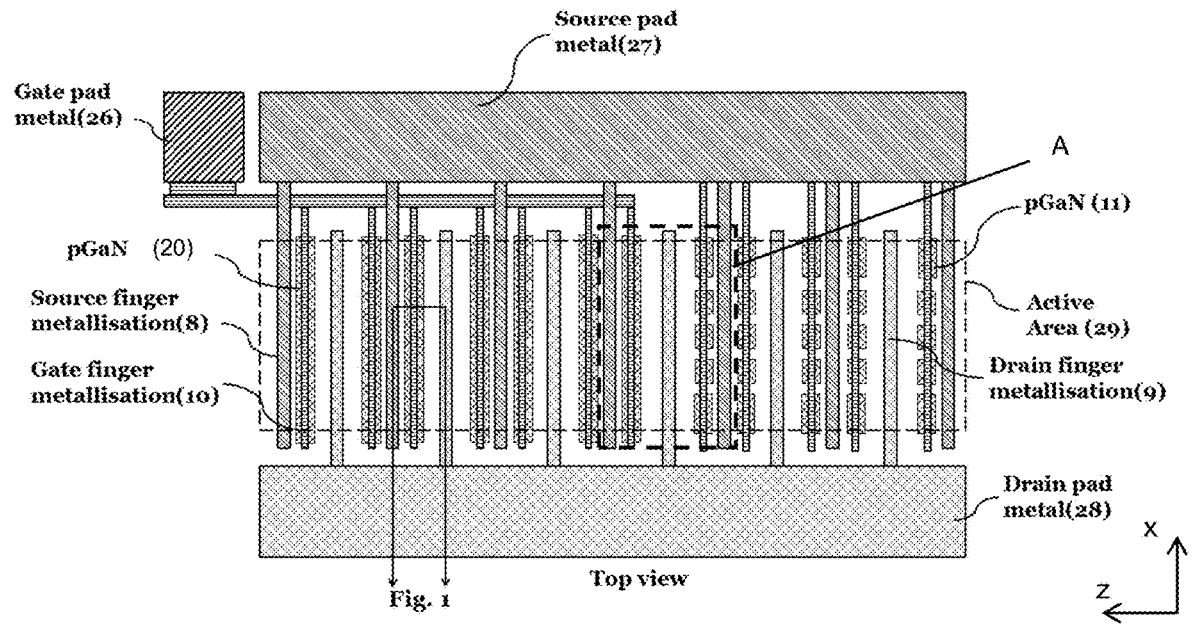
FIG. 14A shows a schematic top view of the layout of a power HEMT with a continuous pGaN gate monolithically integrated with an anti-parallel diode with a discontinuous pGaN gate.
Figure 14B:
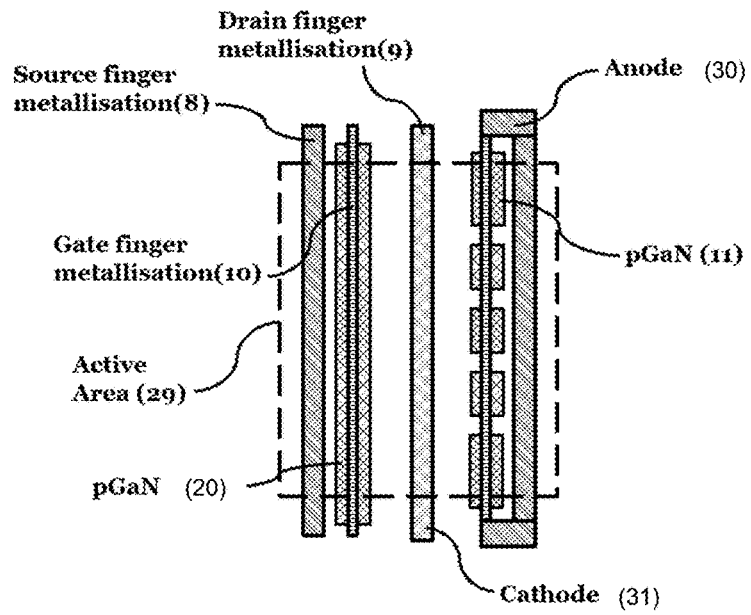
FIG. 14B shows a schematic top view of the layout of a unit cell of the integrated HEMT/anti-parallel diode device shown in FIG. 14A.

FIG. 14A shows a schematic top view of the layout of a power HEMT with a continuous pGaN gate 20 which is monolithically integrated with an anti-parallel diode with a discontinuous pGaN gate 11. FIG. 14B shows a schematic top view of the layout of a unit cell of the integrated HEMT/anti-parallel diode device shown by cell A in FIG. 14A.

This shows a multiple finger structure used to integrate an anti-parallel diode with discontinuous pGaN islands 11. The diode in this example is a diode according to an embodiment of the disclosure, as shown in FIG. 13. The main HEMT device is a normally-off device using a continuous pGaN layer 20 connected to the gate 26 of the device. The diode (which has its source 8 and its internal gate 10 connected together) features discontinuous pGaN islands 11. In this particular lay-out example (shown here in top view), in individual finger structures, one side of the drain is part of the main power device, the normally-off pGaN HEMT, while the other side of the drain 9 acts as the cathode 31 of the anti-parallel diode. The anti-parallel diode has the anode 30 terminal formed as its internal source 8 and internal gate 10 connected together. The drain of the main HEMT is connected to the cathode 31 (drain 9) of the anti-parallel diode while the source of the main HEMT is connected to the anode (source 8 and gate 10) of the anti-parallel diode.

When the main HEMT device is in the on-state (with an appropriate gate bias and the drain bias above the source bias) the anti-parallel diode is off. The diode is in forward conduction (on-state) when the source terminal of the HEMT, which is connected to anode 30 of the diode, is at a higher voltage than the drain of the HEMT, which is connected to the cathode 31 of the diode. In this embodiment, the opening forward voltage of the diode can be controlled by the pitch (distance) between adjacent pGaN islands 11. In order to enable a transversal depletion region to deplete the 2DEG between the pGaN islands 11 when the anode terminal 30 is at 0V (the internal source-gate of the diode is at 0V), the pitch between adjacent pGaN islands 11 is very small. It will be appreciated that by forward opening voltage we mean the voltage at which the diode starts to conduct significant current in the forward direction Alternatively, the source terminal 8 of the diode (part of the anode terminal) can be configured as a Schottky contact to avoid the diode having a zero or negative opening voltage. In this case the pGaN islands 11 also serve to lower the leakage in the off-state, by reducing the tunnelling through the Schottky contact in the blocking mode (reverse bias of the diode) and pushing the electric field away from the Schottky contact (the anode of the diode), towards the cathode.

The gate contact 10 to the pGaN islands 11 can be made of Ohmic or Schottky metallisation. The Schottky contact has the advantage of smaller gate leakage currents, while the Ohmic contact is beneficial to increase stability of the device, and to passivate traps/defects in the AlGaN and GaN buffers by hole injection. It is known that traps are are energy defects in the bandgap Additionally, the diode mode device described here can be used in the pull-down network during turn-off of the auxiliary gate device described in the PCT publication WO/2019/012293A1 and which is incorporated herein by reference in its entirety.

Figure 15A:
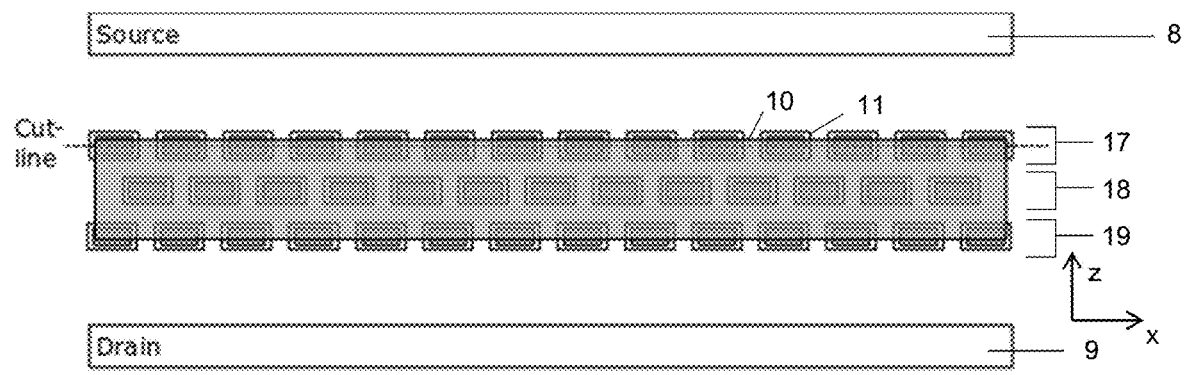
FIG. 15A shows a schematic top view of a device according to an embodiment of the present disclosure in which a second row and a third row of p-doped GaN regions is added in a line parallel to the first row of p-doped GaN regions.

FIG. 15A shows a schematic top view of a device according to a further embodiment of the present disclosure in which a second row 18 and a third row 19 of p-doped GaN regions 11 are added in lines parallel to the first row 17 of p-doped GaN regions 11. This figure shows the device in two dimensions: a first dimension (z-direction) and a second dimension (x-direction). Many of the features of this figure are the same as those shown in FIG. 3 and therefore carry the same reference numerals.

In this embodiment, additional rows of p-doped GaN regions are added in lines 18, 19 parallel to the row 17 of p-doped GaN regions 11 described in previous embodiments. The separation gaps in the additional rows 18, 19 may be misaligned with the gaps in the first row 17. The highly doped p-GaN regions 11 of one of the additional rows 18 are offset in the x-direction from the highly doped p-GaN regions 11 of the first row 17. The gate terminal 10 is operatively connected to all of the highly doped semiconductor regions of all three rows 17, 18, 19.

More than one additional row could be added, and more than one misalignment distance can exist. The separation gaps and the widths of p-doped GaN regions 11 may vary between rows.

Figure 15B:
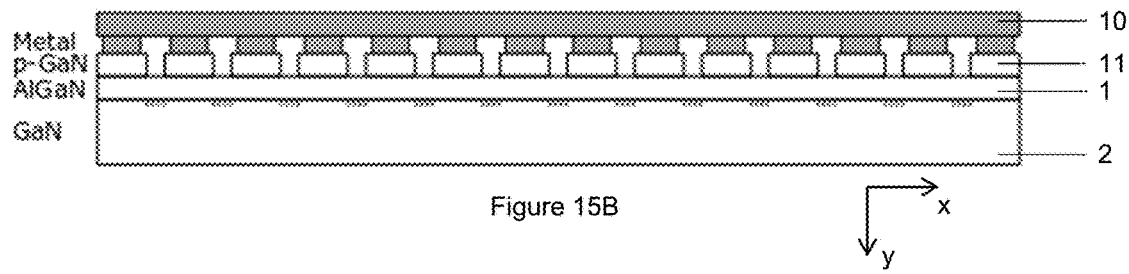
FIG. 15B shows a schematic cross section of the device shown in FIG. 15A.
Figure 16A:
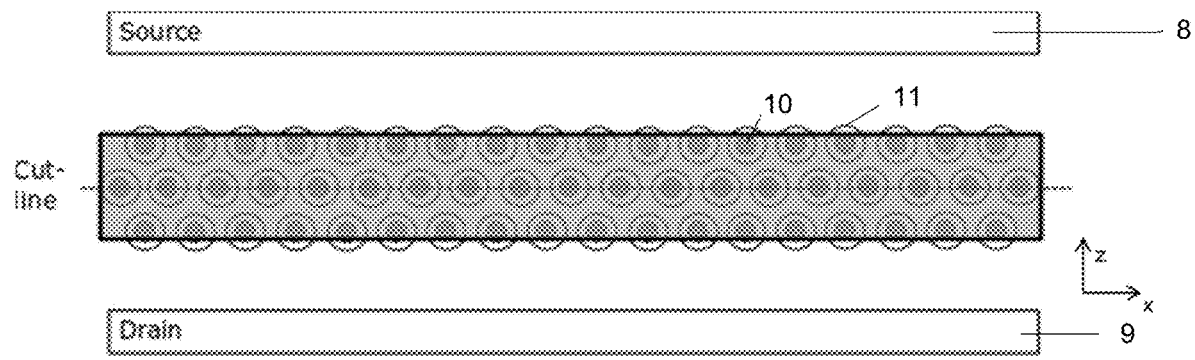
FIG. 16A shows a schematic top view of a device according to an embodiment of the present disclosure in which a second row and a third row of p-doped GaN regions is added in a line parallel to the first row of p-doped GaN regions and the p-doped GaN regions are of a circular rather than a rectangular shape.

FIG. 15B shows a schematic cross section of the device shown in FIG. 16A, along the cutline shown in FIG. 16A. This figure shows the device in two dimensions: a second dimension (x-direction) and a third dimension (y-direction).

FIG. 16A shows a schematic top view of a device according to a further embodiment of the present disclosure where the p-doped GaN regions 11 described in previous embodiments are of a circular rather than a rectangular shape.

Figure 16B:
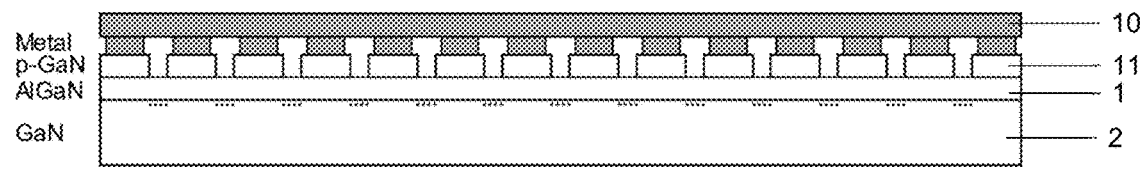
FIG. 16B shows a schematic cross section of the device shown in FIG. 16A.

FIG. 16B shows a schematic cross section of the device shown in FIG. 16A, along the cutline shown in FIG. 16A. This figure shows the device in two dimensions: a second dimension (x-direction) and a third dimension (y-direction).

LIST OF REFERENCE NUMERALS

1 AlGaN layer
2 GaN layer
3 Transition layer
4 Substrate
5 Substrate terminal
6 SiO$_2$ passivation
7 Surface passivation dielectric (not in any figures)
8 Source terminal
9 Drain terminal
10 Gate terminal
11 Discontinuous pGaN cap
12 Schottky gate terminal
13 Conduction channel at zero bias
15 Depletion mode device
16 Enhancement mode device
17 First row of p-GaN islands
18 Second row of p-GaN islands
19 Third row of p-GaN islands
20 Continuous pGaN cap
26 Gate pad metal
27 Source pad metal
28 Drain pad metal
29 Active area
30 Diode anode
31 Diode cathode The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A depletion mode III-nitride semiconductor based heterojunction device, comprising:
    a substrate;
    a III-nitride semiconductor region formed over the substrate, wherein the III-nitride semiconductor region comprises a heterojunction comprising at least one two-dimensional carrier gas of second conductivity type;
    a first terminal operatively connected to the III-nitride semiconductor region;
    a second terminal laterally spaced from the first terminal in a first dimension and operatively connected to the III-nitride semiconductor region;
    at least two discontinuous highly doped semiconductor regions of a first conductivity type formed over the III-nitride semiconductor region, the at least two highly doped semiconductor regions being formed between the first terminal and the second terminal; and
    a gate terminal formed over the at least two highly doped semiconductor regions;
    wherein the at least two highly doped semiconductor regions are spaced apart from each other in a second dimension.

2. A heterojunction device according to claim 1, wherein the second dimension is perpendicular to the first dimension.

3. A heterojunction device according to claim 1, wherein the heterojunction of the III-nitride semiconductor region comprises:
    a first III-nitride semiconductor layer having a first band gap formed over the substrate;
    a second III-nitride semiconductor layer having a second bandgap different from the first band gap disposed on the first III-nitride semiconductor layer; and
    at least one two-dimensional carrier gas formed at the interface between the first and second III-nitride semiconductor layers to provide a channel of a second conductivity type.

4. A heterojunction power device according to claim 3, wherein the first III-nitride semiconductor layer comprises any one of gallium nitride (GaN), aluminium gallium nitride (AlGaN) and indium aluminium gallium nitride (InAlGaN); and wherein the second III-nitride semiconductor layer comprises any one of gallium nitride (GaN), aluminium gallium nitride (AlGaN) and indium aluminium gallium nitride (InAlGaN).

5. A heterojunction device according to claim 1, wherein the at least one two dimensional carrier gas is a two dimensional electron gas (2DEG) or a two dimensional hole gas (2DHG) and wherein the said highly doped semiconductor region is of p-type conductivity if the two 2D carrier gas layer is made of electrons (2DEG) and of n type conductivity if the 2D carrier gas layer is made of holes (2DHG).

6. A heterojunction device according to claim 5, wherein first terminal is a Schottky contact to the 2D carrier gas.

7. A heterojunction device according to claim 1, wherein the device is configured to have a first threshold voltage which defines the transition from off to on state of the device, and wherein the value of the first threshold voltage is adjusted by controlling the distance between the adjacent two highly doped semiconductor regions of first conductivity type.

8. A heterojunction device according to claim 7, wherein the device is configured to have a second threshold voltage at which an increase in the current, or decrease in the on-resistance occurs due to the formation of a two dimensional carrier gas formed under the highly doped semiconductor regions, and wherein the second threshold voltage is higher than the first threshold voltage.

9. A heterojunction device according to claim 1, wherein the at least two highly doped semiconductor regions are aligned along the second dimension.

10. A heterojunction device according to claim 1, wherein the at least two highly doped semiconductor regions of first conductivity type comprise discrete regions, wherein each of the at least two highly doped semiconductor discrete regions is separated from the nearest other highly doped semiconductor regions by a predetermined distance.

11. A heterojunction device according to claim 1, wherein the gate terminal extends in a third dimension between one of the at least two highly doped semiconductor regions and the nearest other highly doped semiconductor region.

12. A heterojunction device comprising:
at least one normally-off gallium nitride based high electron mobility power transistor (HEMT);
and at least one normally-on device according to claim 1;
wherein the normally-on transistor is used as part of a start-up circuit.

13. A heterojunction device comprising:
at least one normally-off gallium nitride based high electron mobility power transistor (HEMT);
and at least one normally-on device according to claim 1;
wherein the normally-on transistor is used as an analogue or logic component as part of a monolithically integrated driver or controller circuit.

14. A heterojunction device comprising:
at least one normally-off gallium nitride based high electron mobility power transistor (HEMT);
and at least one normally-on device according to claim 1;
wherein the normally-on transistor is used as part of any monolithically integrated sensing or protection circuit.

15. A heterojunction power device comprising:
at least one normally-off gallium nitride based high electron mobility transistor (HEMT);
and at least one normally-on device according to claim 1;
wherein the normally-on transistor is used as part of a half-bridge or full bridge circuit.

16. A heterojunction device according to claim 1, wherein the distance between adjacent highly doped semiconductor regions is less than about 1000 nm.

17. A heterojunction device according to claim 1, where the heterojunction device is configured as a low-voltage or low-power device.

18. A heterojunction device according to claim 1, wherein the heterojunction device is configured as a high-voltage or power device.

* * * * *